United States Patent
Esfandiari et al.

(10) Patent No.: US 7,212,072 B1
(45) Date of Patent: May 1, 2007

(54) HIGH LINEARITY SMART HBT POWER AMPLIFIERS FOR CDMA/WCDMA APPLICATION

(75) Inventors: Reza Esfandiari, Huntington Beach, CA (US); Nam-Min Cho, West Hills, CA (US); Alzon B. Canilao, Union City, CA (US); Ron Green, Santa Clara, CA (US); Hyungmo Yoo, Cupertino, CA (US)

(73) Assignee: Dynalinear Technologies, Inc., Campbell, CA (US)

( * ) Notice: Subject to any disclaimer, the term of this patent is extended or adjusted under 35 U.S.C. 154(b) by 0 days.

(21) Appl. No.: 11/288,762

(22) Filed: Nov. 28, 2005

Related U.S. Application Data

(62) Division of application No. 10/782,598, filed on Feb. 18, 2004, now Pat. No. 7,026,876.

(60) Provisional application No. 60/449,201, filed on Feb. 21, 2003.

(51) Int. Cl.
*H03F 3/68* (2006.01)

(52) U.S. Cl. ........................... 330/295; 330/294
(58) Field of Classification Search ............ 330/295, 330/290–294; 326/101, 102; 257/202–206
See application file for complete search history.

(56) References Cited

U.S. PATENT DOCUMENTS

| | | | |
|---|---|---|---|
| 5,258,636 A | 11/1993 | Rumennik et al. | |
| 5,929,464 A | 7/1999 | Yamazaki et al. | |
| 6,232,840 B1 * | 5/2001 | Teeter et al. ............... | 330/295 |
| 6,297,694 B1 * | 10/2001 | Yamamoto .................. | 330/295 |
| 6,404,287 B2 | 6/2002 | Dening et al. | |
| 6,617,928 B2 | 9/2003 | Finlay et al. | |
| 6,750,721 B2 * | 6/2004 | Patterson .................... | 330/295 |
| 6,771,129 B2 | 8/2004 | Riishoj et al. | |
| 6,784,748 B1 | 8/2004 | Canyon et al. | |
| 6,803,643 B2 | 10/2004 | Winslow | |
| 6,803,821 B1 | 10/2004 | DeFalco et al. | |
| 6,838,941 B2 * | 1/2005 | Yamamoto et al. ......... | 330/295 |
| 6,842,075 B2 | 1/2005 | Johnson et al. | |
| 7,026,876 B1 | 4/2006 | Esfandiari et al. | |

* cited by examiner

*Primary Examiner*—Lam T. Mai
(74) *Attorney, Agent, or Firm*—Fenwick & West LLP

(57) ABSTRACT

A power amplifier includes larger size transistors to provide higher power gain at lower frequencies. Transistors of transistor unit cells include a horseshoe-shaped emitter and a strip-shaped base to increase gain. Transistors are combined at a first level to form transistor arrays, which are combined with bonding wires at a second level to an output micro strip transmission line. A Vbe referenced bias circuit may include a smart function to lower quiescent current.

2 Claims, 5 Drawing Sheets

HIGH LINEARITY SMART HBT POWER AMPLIFIERS FOR CDMA/WCDMA APPLICATION

CROSS-REFERENCE TO RELATED APPLICATIONS

This application is a divisional application of U.S. patent application Ser. No. 10/782,598 filed on Feb. 18, 2004, is now a U.S. Pat. No. 7,026,876, which claims benefit of U.S. Provisional Application No. 60/449,201, filed Feb. 21, 2003, which is incorporated herein by reference.

BACKGROUND

The invention relates to power amplifiers, and more particularly to linear power amplifiers.

Current and future digital mobile hand-held communication systems, particularly with code-division multiple access (CDMA), use high efficiency, high linearity, and low cost power amplifiers (PA) for hand held transmitters. Gallium arsenide (GaAs) based heterojunction bipolar transistors (HBT's) are a proven candidate due to their superior power characteristics even at low bias voltages with only a single power supply. In addition to high efficiency and good linearity, the power amplifiers should work at temperature extremes. A typical operating temperature range for a mobile phone is −30° to +85° C., which presents additional challenges for the power amplifier. Traditional bias circuit topologies are inefficient in the precise control of the quiescent bias and dynamic operating point especially at temperature extremes. Currently there are two popular on-chip DC bias approaches used to minimize amplifier temperature variations, namely (i) diode-bias and (ii) current-mirror techniques. The diode bias technique has good temperature compensation, but the diode draws current, which may be significant. The simple current mirrors do not track as well over temperature. For longer battery life many handset manufacturers also include a "smart" bias function so that they can operate the mobile telephones at lower backed off power with much lower standby current.

In addition to improved PA efficiency and bias circuitry, a third issue is to maintain an acceptable system-required amplifier gain with minimum number of power amplifier stages, because the PA also amplifies receive band noise power at the receive frequencies. The noise power interferes with a downlink signal in the handset's receiver and reduces the dynamic range of the receiver. A large number of stages produces stronger receive band noise. Therefore, a minimum number of PA stages is preferred.

Although HBT's enable more efficient linear RF power, practical implementation of these devices faces a number of reliability challenges. The classic destructive thermal runaway phenomenon that is known in silicon bipolar junction transistors (BJT) also exists in GaAs-based HBT's. Any bipolar device which is connected in parallel with other similar devices and which is hotter than its neighbors tends to draw more current, thus heating itself even more and eventually destroying the device. A classic circuit technique, which attempts to avoid this problem, is the use of an emitter ballast resistor, which is used in silicon BJT's. The drawback of this technique is that any voltage drop on the ballast resistor is wasted RF power and therefore reduces amplifier efficiency. Some prior art circuit techniques attempt to reduce the effect of the ballast resistor on output amplifier power by a shunt parallel capacitor, the so-called R/C. ballasting and therefore improve efficiency.

To a first order, the power amplifier performance is defined by the performance of the single transistor unit cell. Therefore, an optimum unit cell design improves amplifier performance. The transistor combining is done in several levels of hierarchy. First, transistor unit cells are connected in parallel to form a transistor array (or a larger transistor cell). Second, the transistor arrays are again combined to form the final power transistor. In order to achieve high efficiency, the output power transistor (thus the unit cell) has high power gain at the operating frequency while maintaining amplifier stability. As the power amplifier is optimally matched at high power, a transistor of the transistor unit cell has the best maximum available gain. There are two main geometries for HBT unit cell used in the prior art: a stripe (rectangular) emitter geometry and a circular geometry. The advantages of the stripe geometry include high maximum gain and capability in connecting bases in parallel for a lower parasitic base resistance. The advantages of a circular HBT layout include low parasitic base resistance and capability of making a large emitter area per unit cell with the largest emitter perimeter per unit emitter area, and the higher maximum gain.

For power amplifiers that have many devices in parallel in order to obtain the required output power level, a common issue is not losing the amplifier gain and power through combining loss and thus resulting low efficiencies. A typical microwave circuit approach is to use a "tree" topology for splitting or combining the signal for the input or output such that there is an equal delay from the input to each transistor and to the output combination point. With a low loss dielectric like GaAs, the combining efficiency is good with this approach. However, at cellular and PCS frequencies, this would result in a very large die size because the wavelength of the signal is very long.

SUMMARY OF THE INVENTION

To achieve an acceptable amplifier power gain, with a minimum number of stages, a good HBT process technology, an optimum HBT device geometry, and an efficient device combining topology are desired. With the present invention, HBT power amplifier design improvement in gain and power added efficiency (PAE) may be achieved with the robust circuit design that includes novel active device bias with switch sensing smart function capability, optimum HBT unit cell geometry with proper base resistance for RF stability, and efficient unit device combining topology with proper suppression of odd mode oscillation.

A family of high linearity HBT power amplifier has been developed. The amplifiers relate to Personal Communication Systems (PCS) and Wideband Code Division Multiple Access (WCDMA) phones with assigned frequency band around 1700–2000 MHz. The amplifier comprises an HBT GaAs monolithic microchip mounted on a 6×6 or 4×4 millimeter square of an at least two layer copper clad laminated substrate. This efficient amplifier packs full function into a single small micro-module package.

The single transistor unit cells are combined in parallel in order to provide first and second stages of the microchip amplifier. The first stage may be coupled to the output power stage by an on-chip thin film capacitor. The combination of this capacitor and off-chip components constructed on the substrate may be used to impedance-match the amplifier stages. The input matching circuit may be fully constructed on the microchip. The inter-stage and the output matching circuit may be partially constructed on the microchip and off-chip component assembled on the substrate. The microchip grounding may be accomplished by either bonding wires or through GaAs substrate via holes. The module grounding may be done through substrate via holes.

In one aspect of the invention, a power device may have larger sized transistor unit cells, because the inventors have discovered that larger size transistors have higher power gain at lower frequency. A power device may include an 84 square micrometer horseshoe unit cell HBT. In another aspect of the invention, a unit cell transistor may include a horseshoe-shaped emitter and a strip-shaped base geometry to provide higher transistor gain.

In another aspect, the output power transistor may use a two level 4 way transistor combining technique to combine 4 pairs of transistor arrays (or larger transistor cells) with bonding wires to the output micro strip transmission lines constructed on the laminated substrate. Collectors of two transistor arrays are connected to a wire bonding pad located in the middle of the two transistor arrays. A total of four wire bonding pads are located on the chip. In another aspect, odd mode resistors may be coupled in between larger HBT cells to improve the RF efficiency and stability of the combiner.

In a further aspect of the invention, a unique and novel biasing technique may be used for biasing the power transistors. A smart function may be integrated into this bias circuit in order to allow efficient lower power operation at lower quiescent current. This biasing provides excellent linear power, efficiency and very low quiescent (standby) current from amplifiers. The bias circuit may include a low temperature coefficient circuit for very low and very high temperature operation.

DETAILED DESCRIPTION

The HBT cell unit size is described.

The emitter ballast resistors are believed to help the thermal stability of power HBT. However, a portion of the output power is dissipated in those resistors and this reduces PAE, particularly at a low supply voltage. Extensive reliability tests revealed that power HBT's can be operated with no emitter ballast resistors without the thermal runaway phenomenon with a lower emitter current density. The present invention relates to an improved design comprising a robust HBT and circuit topologies that includes optimum unit HBT geometry with proper base resistance for RF stability, and efficient unit device combining topology with combining odd mode resistors and a novel active device bias with switch sensing smart function capability. To further improve PAE an optimum HBT geometry and an optimum HBT combining art are selected. The inventors have discovered that larger size transistors have higher power gain at lower frequency.

Figure 1:
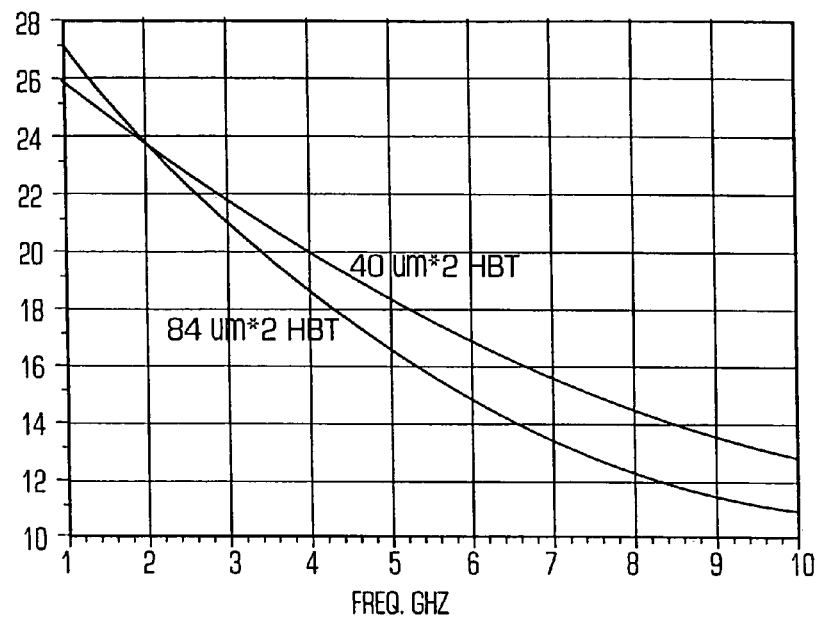
FIG. 1 is a graph illustrating gain versus frequency for 40 and 84 square microns heterojunction bipolar transistors having the same current density and process.

FIG. 1 is a graph illustrating a gain versus frequency plot for 40 and 84 square micrometer heterojunction bipolar transistors having the same current density and process. The larger 84 square micron cell has a higher gain up to 2 GHz. The gain is larger for the smaller 40 square micron devices above 2 GHz.

Another advantage of a larger unit cell is that it improves combining efficiency by combining less unit cells for achieving the same emitter area for a desired power. In one embodiment, an 84 square micron unit cell HBT is used in the power devices. In another embodiment, the HBT includes a horseshoe-shaped base and a strip-shaped emitter to provide higher transistor gain.

The unit cell geometry is next described.

Figure 2:
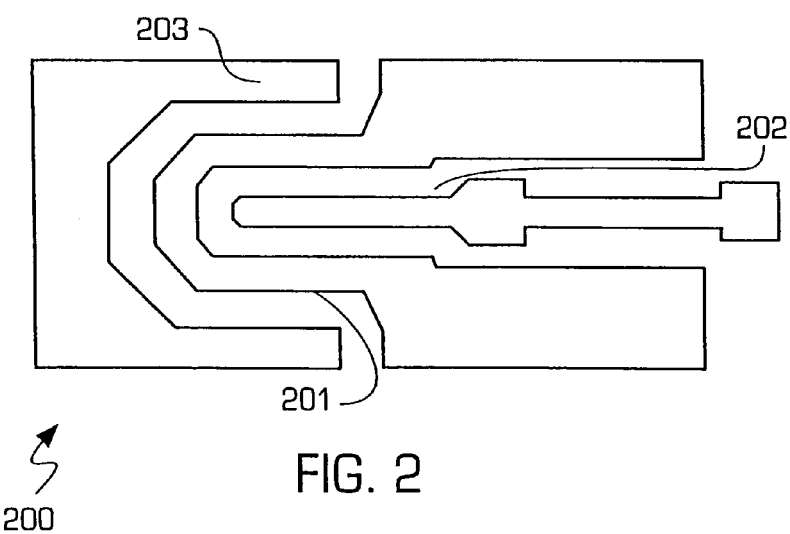
FIG. 2 is a top plan view of a horseshoe shaped based and emitter stripe geometry of a heterojunction bipolar transistor.

FIG. 2 is a top plan view of a horseshoe shaped emitter and base strip geometry of a heterojunction bipolar transistor 200.

The heterojunction bipolar transistor 200 comprises an emitter 201 that is generally horseshoe-shaped in a top plan view, a base 202 that is generally strip shaped in a top plan view, and a collector 203 that generally is in a shape having one side spaced apart from the horseshoe shaped emitter 201 in a top plan view.

The horseshoe-shaped HBT unit cell has advantages over stripe or circular geometries, which include lower parasitic base resistance and lower parasitic base-collector capacitance (Cbc).

Power combining is next described.

Figure 3:
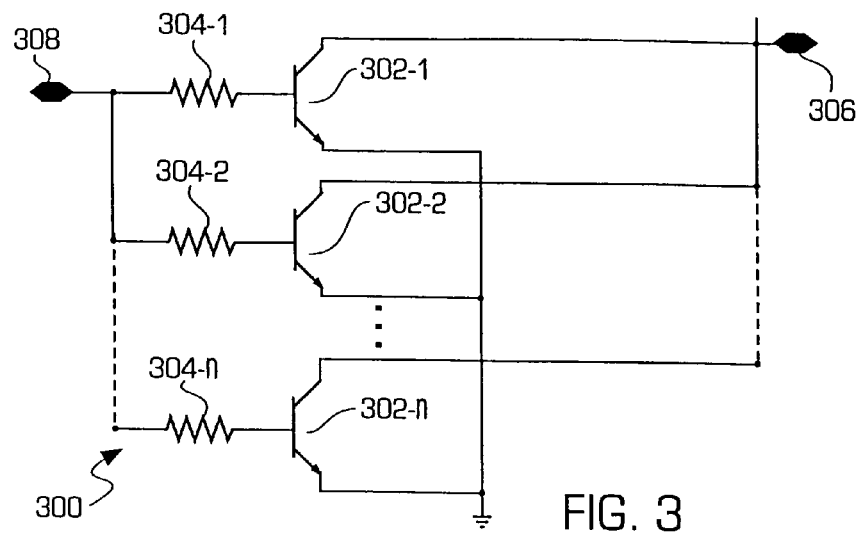
FIG. 3 is a schematic diagram illustrating a first level transistor arrays including an array of parallel HBT unit cells with base resistors.

FIG. 3 is a schematic diagram illustrating a first level transistor array 300 comprising an array of parallel HBT unit cells 302-1 through 302-8 including base resistors 304-1 through 304-n. The collectors of the HBT unit cells 302 are coupled to a node 306. The emitters of the HBT unit cells 302 are grounded. The base resistors 304-1 through 304-n couple an input node 308 to the base of the respective HBT unit cells 302-1 through 302-8.

This approach allows for more efficient packing of the amplifier devices because all the horseshoe-shaped transistor unit cells (see FIG. 2) can share the same isolation region and a common collector contact. The actual number of devices so connected is a balance between adding more devices to increase-power and keeping the number small to keep the gain high. A small number of devices means that the difference in length of the base feed between any two devices is insignificant and there is a high input combining efficiency. As the number of parallel devices increases, the input combining efficiency decreases. The inventors have found for this simple base feed approach that eight devices are a good compromise between power and input/output combining gain.

Figure 4:
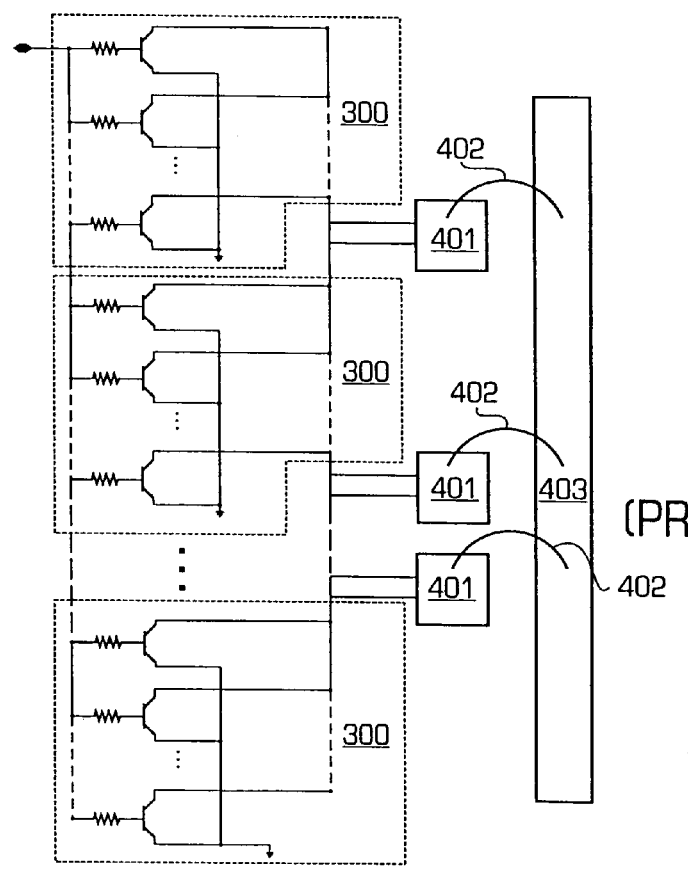
FIG. 4 is a block diagram illustrating an output power transistor for an amplifier using a conventional combining topology.

FIG. 4 is a block diagram illustrating an output power transistor 400 for an amplifier using a conventional combining topology. The outputs of a plurality of first level transistor arrays 300 are coupled to a corresponding bonding pad 401. The bonding pads 401 are disposed adjacent to the end of the parallel HBT's, and are combined with a corresponding bonding wire 401 to a bonding strip 403. In an illustrative embodiment, four bonding pads 401 are each coupled to a respective number n of transistors, and are coupled to the bonding strip 403. The bonding pads 401 is disposed near the edge of the chip. The bonding strip 403 may be formed of a laminated substrate, such as two or four layers.

Figure 5:
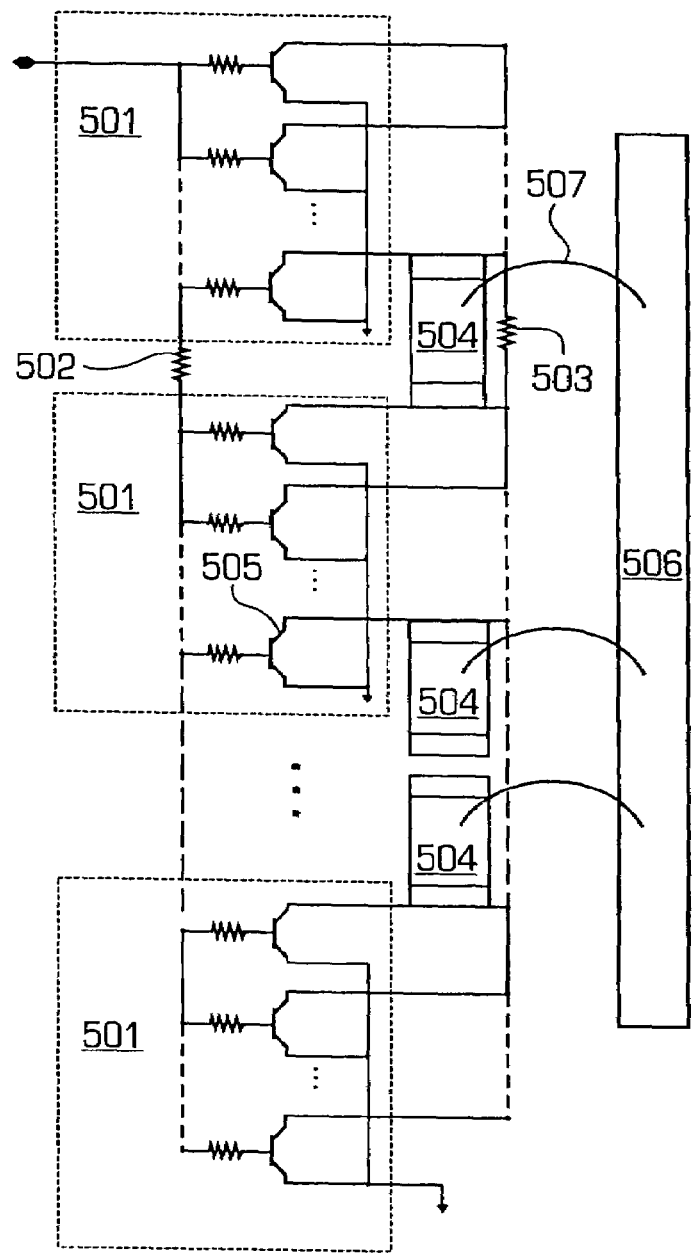
FIG. 5 is a block diagram illustrating an output power transistor for an amplifier using a combining technology according to the present invention.

FIG. 5 is a block diagram illustrating an output power transistor 500 for an amplifier using a combining topology according to the present invention. First level transistor arrays (or power cells) 501 may be similar to the transistor arrays 300. Bonding pads 504 are disposed between parallel HBT unit cells 505 of the first level transistor array 501 near the collectors of the power transistors, for example, at a minimum distance to the collectors. (For simplicity and clarity, only one HBT unit cell 505 is labeled.) The bonding pads 504 are coupled to a bonding strip 506. In one embodiment, bonding wires 507 couple the bonding pads 504 to the bonding strip 506. In an illustrative embodiment, the combining system is a four-way combining system that includes four bonding pads 504 coupled by four bonding wires 507 to the bonding strip 506, but other numbers of combining may be used. To improve the RF efficiency and stability of the combiner, odd mode shunts (or resistors 502 and 503) may be coupled between respective inputs and outputs of transistor arrays 501. Furthermore, to improve gain, an on chip first stage matched HBT with inductive emitter grounding may be used. Inductive grounding tends to improve device gain.

This power combining design reduces the area of a chip by at least 500 square micrometers as compared with prior art "tree" combining technique.

The arrangement of the amplifier 500 has two transistor arrays 501 sharing one bonding pad, the collector contacts on opposite sides of the square bonding pad. By symmetrically arranging eight columns of transistor arrays 501 around 4 bonding pads 504 in a simple array and sharing common base feed lines, a compact and efficient layout is realized for the output power transistor. At this point all the devices have virtually identical electrical delay from each collector to the associated bonding wire due to the simple nature of the layout. Instead of using any type of "tree" combining structure, inventors use bonding wires 507, one from each pair of two transistor arrays 501. This gives a very low loss (with air as dielectric), virtually equal-length efficient output combining network.

A power amplifier including a bias circuit with temperature compensation is next described.

In a further aspect of the invention, a unique and novel biasing technique is used for biasing the power transistors. A smart function is integrated into the bias circuit in order to allow efficient lower power operation at a lower quiescent current.

Figure 6:
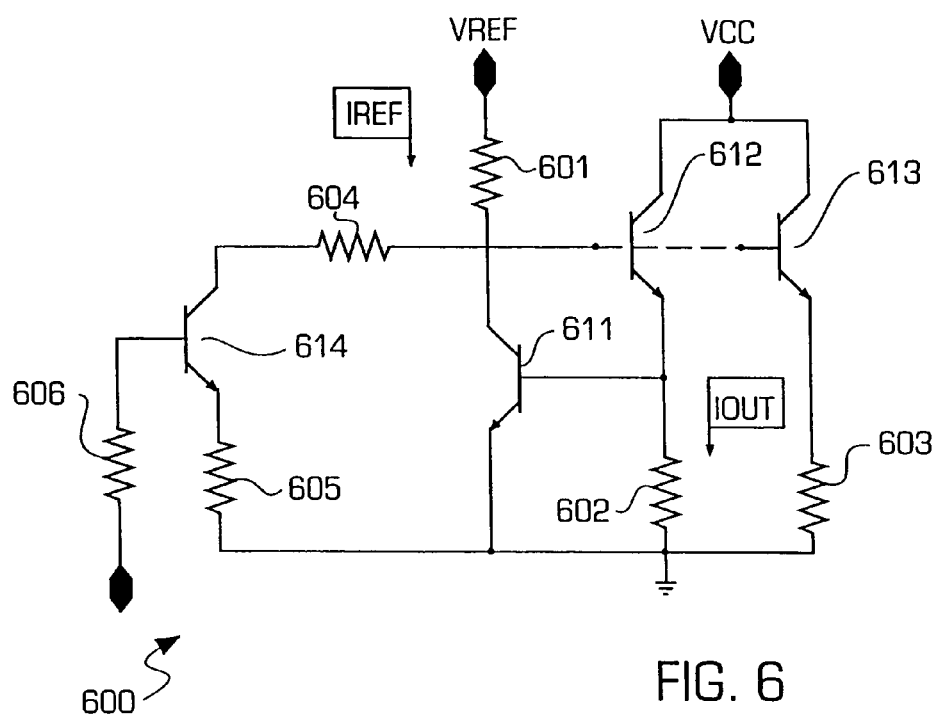
FIG. 6 is a schematic diagram illustrating a base-emitter voltage reference current generator with a switch function to control quiescent current.
Figure 7:
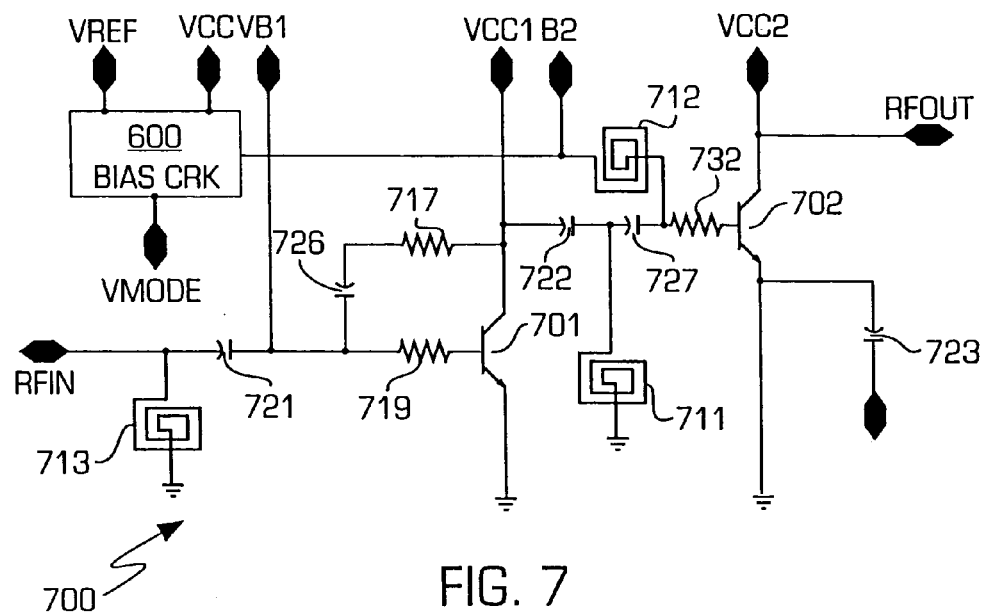
FIG. 7 is a schematic diagram illustrating a heterojunction bipolar transistor monolithic integrated power amplifier chip.

FIG. 6 is a schematic diagram illustrating a base-emitter voltage (Vbe) reference current generator 600 with added temperature compensation circuit and mode switch. The Vbe reference current generator circuit 600 is similar to that described in *Analysis and Design of Analog Integrated Circuits, Second Edition* by Paul R. Gray and Robert G. Meyer, but is modified and designed to set the proper operating point for the amplifier. The complete amplifier circuit is illustrated in FIGS. 6 and 7. The Vbe reference current generator 600 uses a control voltage standard different from power supply. The supply-independent biasing makes the current generator output current less dependent on power supply voltage. Bias reference circuits can be classified by the source of voltage standard by which the bias current is established. The most convenient of this standard is the Vbe of the transistor. The reference current is forced to flow in a transistor 611, and, in order for this to occur, the transistor 612 supplies enough current into a resistor 602 so that the base-emitter voltage of the transistor 611 is equal to Vbe*Iref. Neglecting base currents, the current Iout is equal to the emitter current of the transistor 612, which is the current flowing through the resistor 602. Because the resistor 602 has a voltage equal to one base-emitter drop across it, the output current is proportional to this base-emitter voltage. Furthermore the voltage Vbe has a negative temperature coefficient, thus, with proper selection of transistor scales this characteristic will help temperature sensitivity of the amplifier. This feature provides better RF performance at high temperature (such as more constant power gain).

A transistor 614 and a plurality of resistors 604, 605, and 606 form a mode switch to control the quiescent operating point of the transistor 611. A transistor 613 and a resistor 603 provide the quiescent operating currents for RF transistors 701 and 702 of FIG. 7.

Three separate voltages set the bias or operating condition of the amplifier. A voltage Vcc sets the amplifier operating voltage. A reference voltage Vref sets the quiescent current of the amplifier. And finally the smart function Vmode for controlling Vref quiescent operating point without changing the Vref voltage for lower power energy efficient operation of the amplifier. Each voltage is controlled separately from a corresponding pin on the module.

Figure 8:
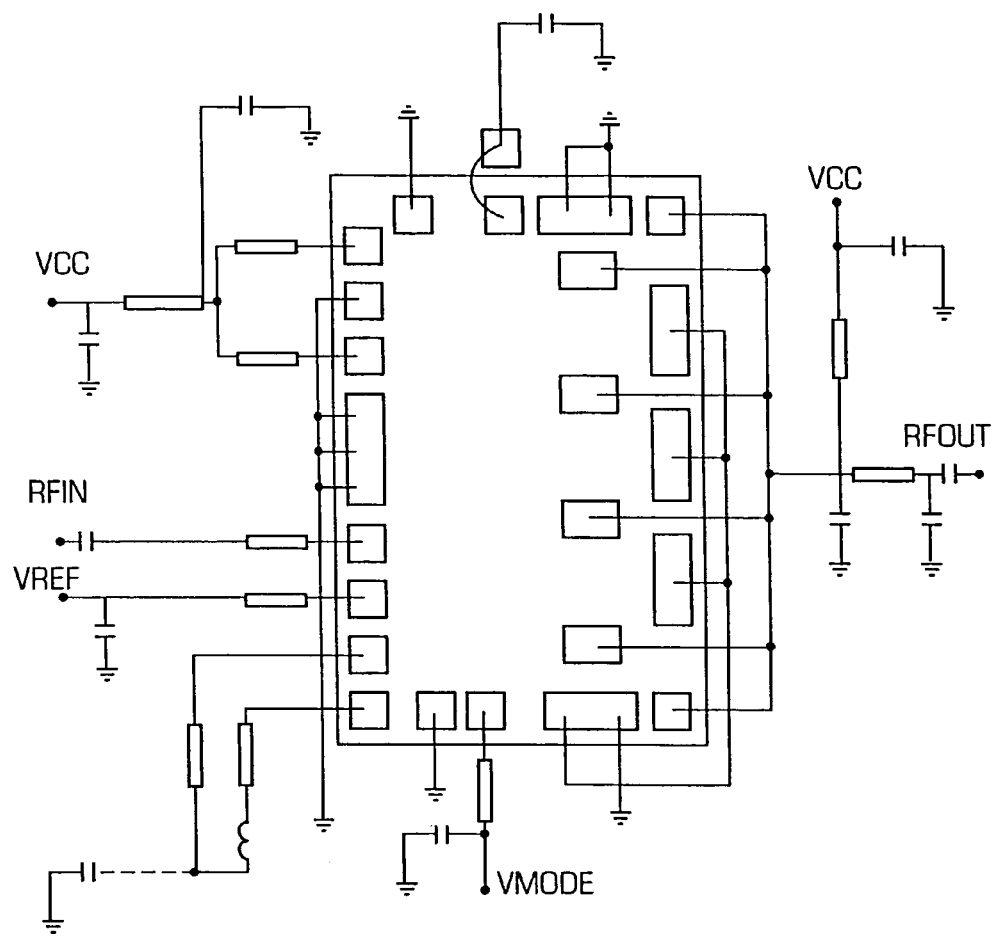
FIG. 8 is a diagram illustrating the heterojunction bipolar transistor monolithic integrated power amplifier chip of FIG. 7 on a micromodule substrate.

FIG. 7 is a schematic diagram illustrating a HBT monolithic integrated power amplifier chip 700. FIG. 8 is a diagram illustrating the power amplifier 700 on a micro module substrate.

In one embodiment, the power amplifier 700 may have electrical characteristics similar to that of a conventional two-stage amplifier. The improved RF performance of the amplifier 700 relates to the embodiments of the unique unit HBT selection (FIG. 1), the power HBT combining method (FIG. 5), the bias circuit (FIG. 6) and the selection of input transistor matching circuit and grounding choice. All pins of the chip are labeled with a capital letter followed by sub-letter indicating a contact pad number on the monolithic chip. These pads are wire bonded to a 6×6 or 4×4 millimeter square of at least two layer copper clad laminated substrates with micro strips and passive electrical components which has preset electrical characteristic as illustrated in FIG. 8.

The power amplifier 700 comprises a first stage transistor 701 and a second stage transistor 702. The RF input (RFin) is applied through a capacitor 721 and a resistor 719 to the base of the transistor 701. An inductor 713 provides inductive matching of the RF input signal. A series connected resistor 717 and a capacitor 726 provide RF feedback for transistor 701. The output of the first stage is coupled through capacitors 722 and 727 to the input of the second stage (a resistor 718 coupled to the base of the transistor 702), and includes inductive grounding with an inductor 711 between the capacitors 722 and 727. The current generator 600 (FIG. 6) provides a bias current with inductive coupling through an inductor 712 to the resistor 712. A capacitor 723 is coupled to the emitter of the transistor 702. In one embodiment, the values of the capacitors, inductors and micro strips transmission lines are selected to adapt to the frequency band of 1700 MHz, 1800 MHz and 1900 MHz.

What is claimed is:

1. An amplifier comprising:
    a chip including:
        a plurality of transistor arrays, each transistor array comprising a plurality of transistors, each transistor including a collector coupled to an output node, including a base coupled to an input node, and including an emitter coupled to a ground node, and a plurality of local pads, each local pad being disposed between collectors of transistors in adjacent transistor arrays and coupled to the output nodes of said adjacent transistor arrays; and a global pad outside the chip coupled to each of the plurality of local pads by wirebonds.

2. The amplifier of claim 1 wherein the transistor is a heterojunction bipolar transistor (HBT), the HBT includes a collector having a horseshoe shaped cavity, includes a horseshoe-shaped emitter disposed in the cavity of the collector and having a horseshoe shaped cavity, and includes a strip-shaped base and disposed inside the cavity of the emitter, wherein the HBTs of each transistor array are arranged in a row, wherein each local pad is disposed between the collectors of transistors on ends of the rows of adjacent transistor arrays.

* * * * *